(12) United States Patent
Dear

(10) Patent No.: US 11,817,279 B2
(45) Date of Patent: *Nov. 14, 2023

(54) SENSOR ASSEMBLIES

(71) Applicant: LONGVALE LTD, Staffordshire (GB)

(72) Inventor: Nathan Dear, Staffordshire (GB)

(73) Assignee: LONGVALE LTD, Staffordshire (GB)

( * ) Notice: Subject to any disclaimer, the term of this patent is extended or adjusted under 35 U.S.C. 154(b) by 0 days.

This patent is subject to a terminal disclaimer.

(21) Appl. No.: 18/100,088

(22) Filed: Jan. 23, 2023

(65) Prior Publication Data

US 2023/0162933 A1 May 25, 2023

Related U.S. Application Data

(63) Continuation of application No. 17/487,713, filed on Sep. 28, 2021, now Pat. No. 11,562,868.

(30) Foreign Application Priority Data

Feb. 9, 2021 (GB) .................................. 2101771

(51) Int. Cl.
*H01H 36/00* (2006.01)
(52) U.S. Cl.
CPC ...... *H01H 36/0073* (2013.01); *H01H 36/008* (2013.01)
(58) Field of Classification Search
CPC ............. H01H 36/0073; H01H 36/008; G01R 33/0088

(Continued)

(56) References Cited

U.S. PATENT DOCUMENTS 4,837,539 A 6/1989 Baker
5,120,963 A * 6/1992 Robinson ................. G01V 5/04
250/361 R (Continued)

FOREIGN PATENT DOCUMENTS

GB 2541104 2/2017
GB 2588568 4/2021

OTHER PUBLICATIONS

Examination Report for corresponding application GB2101771.0, dated Mar. 5, 2021, 5 pages.

(Continued)

*Primary Examiner* — Shawki S Ismail
*Assistant Examiner* — Lisa N Homza
(74) *Attorney, Agent, or Firm* — Lee & Hayes, P.C.

(57) ABSTRACT

A magnetic proximity sensor assembly 10. The magnetic proximity sensor assembly 10 comprises a switch assembly 12 received in a blind bore 14 of a body tube 16. The switch assembly 12 comprises a magnetic assembly 18 moveable in the blind bore 14. The switch assembly 12 comprises an operator 42 which extends from the magnetic assembly 18 and serves as a drive for a moving contact 44 positioned between a first contact 46 and a second contact 48. The magnetic assembly 18 comprises a primary magnet 20 and a biasing magnet 22. The switch assembly 12 comprises a center magnet 26 interposed between the primary magnet 20 and the biasing magnet 22. The blind bore 14 has a uniform bore diameter. The magnetic proximity sensor assembly 10 comprises a sleeve 28 in the blind bore 14 contacting the closed end 30 of the blind bore 14. The switch assembly 12 is seated on the sleeve 28 such that the primary magnet 20 of the magnetic assembly 18 is surrounded by the sleeve 28.

11 Claims, 8 Drawing Sheets

(58) Field of Classification Search
USPC .......................................................... 335/205
See application file for complete search history.

(56) References Cited

U.S. PATENT DOCUMENTS

| | | | |
|---|---|---|---|
| 9,368,302 | B2 | 6/2016 | LaFountain et al. |
| 11,214,462 | B2* | 1/2022 | Pedoeem ................ B65H 75/48 |
| 2011/0147160 | A1* | 6/2011 | Kuehl ........................ F16D 1/10 |
| | | | 192/82 R |
| 2011/0153739 | A1* | 6/2011 | McCoy .............. H01R 13/7031 |
| | | | 709/204 |
| 2013/0116818 | A1* | 5/2013 | Hamilton .................. A61J 7/04 |
| | | | 700/236 |
| 2013/0169388 | A1 | 7/2013 | LaFountain et al. |
| 2016/0365208 | A1* | 12/2016 | LaFountain ........ H01H 36/0073 |
| 2017/0191855 | A1* | 7/2017 | Hiron-Jones .......... G01D 11/26 |
| 2017/0281471 | A1* | 10/2017 | Hamilton .............. A61J 7/0076 |
| 2019/0202655 | A1* | 7/2019 | Pedoeem ........... B65H 75/4471 |
| 2021/0190202 | A1* | 6/2021 | Alu ......................... F16H 59/08 |
| 2022/0254589 | A1 | 8/2022 | Dear |

OTHER PUBLICATIONS

Office Action for U.S. Appl. No. 17/487,713, dated Jan. 20, 2022, Dear, "Sensor Assemblies", 9 pages.
Office Action for U.S. Appl. No. 17/487,713, dated Apr. 28, 2022, Dear, "Sensor Assemblies", 10 pages.
PCT Search Report and Written Opinion dated Apr. 13, 2022 for PCT Application No. PCT/GB22/50150, 15 pages.

* cited by examiner

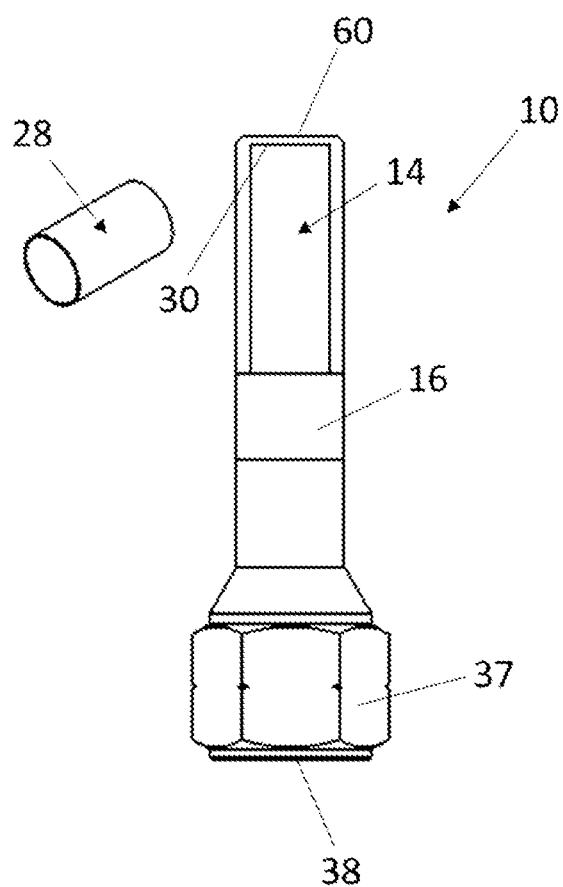 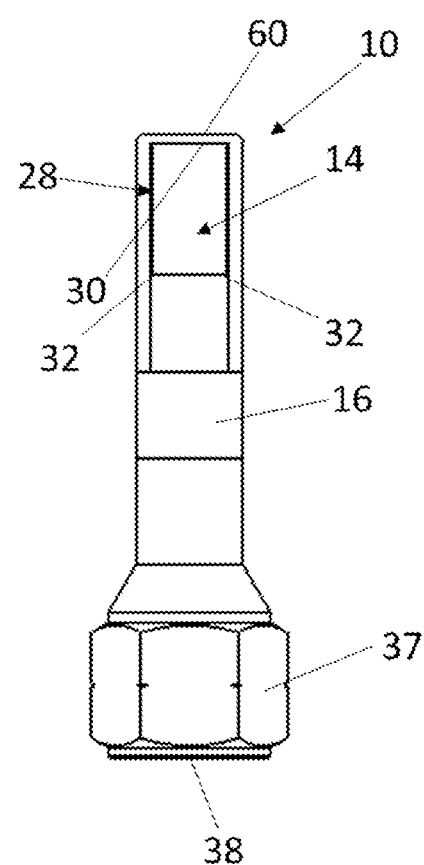
Fig. 8A
Fig. 8B

SENSOR ASSEMBLIES

CROSS REFERENCE TO RELATED APPLICATIONS

This application is a continuation of U.S. patent application Ser. No. 17/487,713, filed Sep. 28, 2021, entitled "SENSOR ASSEMBLIES," which claims priority to GB2101771.0, filed Feb. 9, 2021, the entire contents of which are incorporated by reference herein.

TECHNOLOGICAL FIELD

Examples of the disclosure relate to sensor assemblies, and particularly magnetic proximity sensor assemblies.

BACKGROUND

Magnetic proximity sensor assemblies for monitoring the position of magnetic or ferromagnetic targets are known.

A typical magnetic proximity sensor assembly comprises a switch assembly received in a blind bore of a body tube. The switch assembly comprises a magnetic assembly moveable in the blind bore. The switch assembly also comprises and an operator which extends from the magnetic assembly and serves as a drive for a moving contact positioned between a first contact and a second contact.

When a target, such as a magnet or ferrous object, is within the sensing range of the magnetic proximity sensor assembly, the magnetic assembly moves in the blind bore from a magnetically biased position towards the target. In this position of the magnetic assembly, the moving contact is urged by the operator into contact with the first contact to complete a first electrical circuit.

In the absence of a target within a sensing range, the magnetic assembly adopts the magnetically biased position in the blind bore. In the magnetically biased position of the magnetic assembly, the moving contact is urged by the operator into contact with the second contact to complete a second electrical circuit.

In use, a controller is configured to continuously supply an electrical input signal to the magnetic proximity sensor assembly, and to monitor the electrical output signal. The electrical output signal is different for the first and second electrical circuits. Accordingly, by monitoring the electrical output signal it can be determined whether or not the target is within the sensing range of the magnetic proximity sensor assembly.

The switch assembly must be precisely positioned in the blind bore to facilitate the in-use movement of the magnetic assembly. Typically, the blind bore is provided with a varying diameter to provide a shoulder on which the switch assembly is seated at the required position in the blind bore. However, this is both challenging to achieve and difficult to detect from a quality control perspective.

BRIEF SUMMARY

According to various, but not necessarily all, examples of the disclosure there is provided a magnetic proximity sensor assembly, the magnetic proximity sensor assembly comprising a switch assembly received in a blind bore of a body tube, wherein the switch assembly comprises a magnetic assembly moveable in the blind bore, wherein the switch assembly comprises an operator which extends from the magnetic assembly and serves as a drive for a moving contact positioned between a first contact and a second contact, wherein the magnetic assembly comprises a primary magnet and a biasing magnet, wherein the switch assembly comprises a center magnet interposed between the primary magnet and the biasing magnet, wherein the blind bore has a uniform bore diameter, wherein the magnetic proximity sensor assembly comprises a sleeve in the blind bore contacting the closed end of the blind bore, wherein the switch assembly is seated on the sleeve such that the primary magnet of the magnetic assembly is surrounded by the sleeve.

Possibly, the sleeve is configured such that in use movement of the magnetic assembly in the blind bore causes the primary magnet to move only within an area of the blind bore defined by the sleeve.

Possibly, the distance between the closed end of the blind bore and the primary magnet is defined by the length of the sleeve. Possibly, the sleeve is configured to space apart the primary magnet and the closed end.

The blind bore may be a cylindrical blind bore.

Possibly, the switch assembly is seated on a rim of the sleeve. Possibly, the center magnet is comprised in a center housing molding of the switch assembly, wherein the center housing molding is seated on the sleeve. The sleeve may be cylindrical.

Possibly, the magnetic proximity sensor assembly comprises a flux sleeve, wherein the switch assembly is seated on the sleeve such that the flux sleeve is also surrounded by the sleeve.

Possibly, the first contact is a normally open contact and the second contact is a normally closed contact.

The sleeve may comprise Mu-metal.

According to various, but not necessarily all, examples of the disclosure there is provided a method of manufacturing a magnetic proximity sensor assembly according to the preceding paragraphs, wherein the method comprises:
  providing a body tube comprising a blind bore, wherein the blind bore has a uniform bore diameter;
  inserting a sleeve into the blind bore such that the sleeve contacts the closed end of the blind bore;
  inserting a switch assembly into the blind bore;
  seating the switch assembly on the sleeve such that the primary magnet of the magnetic assembly is surrounded by the sleeve.

The method comprises forming the blind bore by a drilling operation.

According to various, but not necessarily all, examples of the disclosure there may be provided examples as claimed in the appended claims.

BRIEF DESCRIPTION

For a better understanding of various examples that are useful for understanding the detailed description, reference will now be made by way of example only to the accompanying drawings in which:

FIG. 8A illustrates two of the elements of the magnetic proximity sensor assembly of FIG. 1 in part cross sectional view;

FIG. 8B illustrates the two elements of FIG. 8A in an assembled condition; and

DETAILED DESCRIPTION

Figure 1:
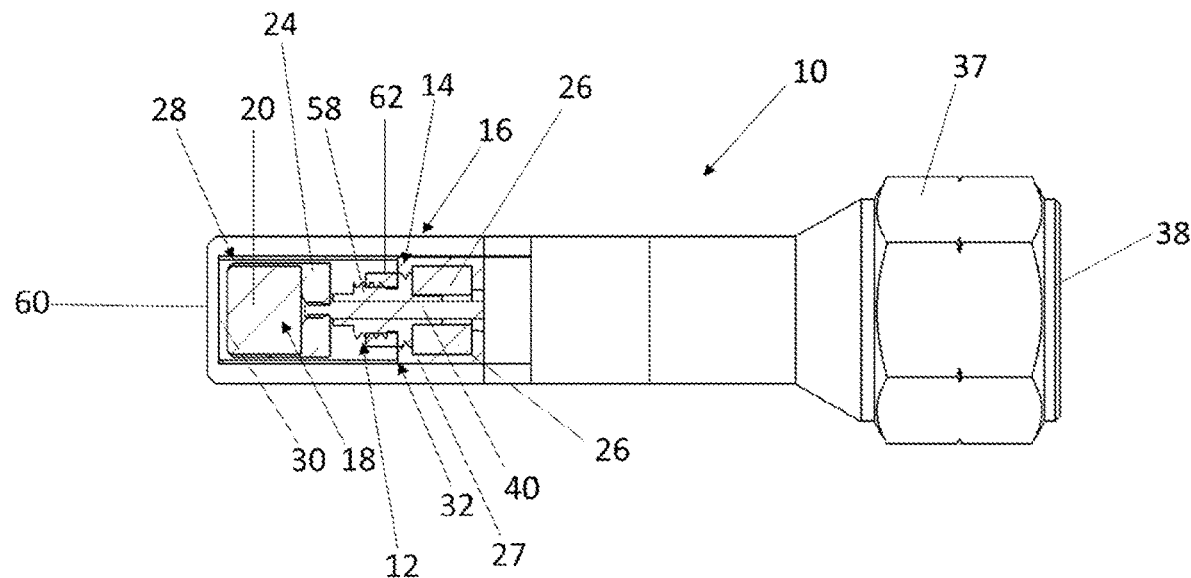
FIG. 1 illustrates a part cross sectional view of a magnetic proximity sensor assembly accordingly to examples of the disclosure.
Figure 2:
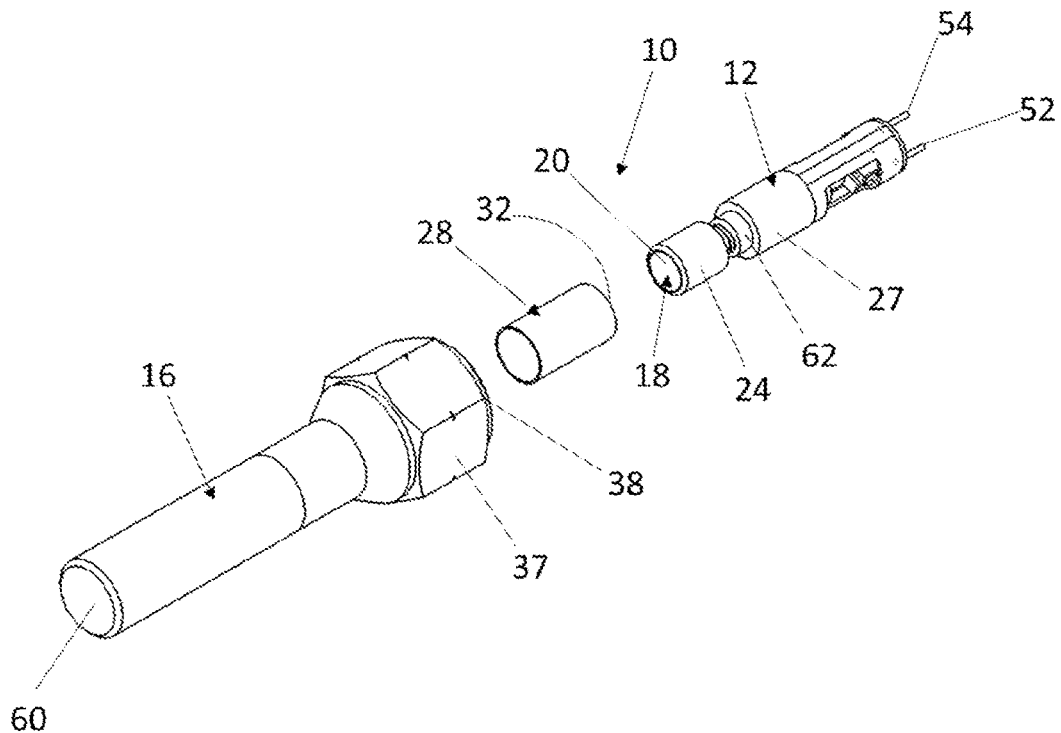
FIG. 2 illustrates an exploded view of the magnetic proximity sensor assembly of FIG. 1.

The figures illustrate a magnetic proximity sensor assembly 10 and a method of manufacturing the magnetic proximity sensor assembly 10.

The magnetic proximity sensor assembly 10 comprises a switch assembly 12. The switch assembly 12 is received in a blind bore 14 of a body tube 16. The blind bore 14 has a uniform bore diameter. Accordingly, the blind bore 14 has straight sides. The blind bore 14 may be a cylindrical blind bore. The blind bore 14 is an inner blind bore.

The switch assembly 12 comprises a magnetic assembly 18 moveable in the blind bore 14. The magnetic assembly 18 comprises a primary magnet 20 and a biasing magnet 22 (see FIGS. 3 and 5). The primary magnet 20 is comprised in a primary magnet holder 24. The switch assembly 12 comprises a center magnet 26 interposed between the primary magnet 20 and the biasing magnet 22. The center magnet 26 is comprised in a center housing molding 27 of the switch assembly 12. The switch assembly 12 is a cartridge. The switch assembly 12 may also be referred to as a sensor element.

The magnetic proximity sensor assembly 10 comprises a sleeve 28 in the blind bore 14. The sleeve 28 may be referred to as a shim. According, the sleeve 28 is received in the blind bore 14. The sleeve 28 contacts the closed end 30 of the blind bore 14. The switch assembly 12 is seated on the sleeve 28 such that the primary magnet 20 of the magnetic assembly 18 is surrounded by the sleeve 28. Accordingly, the primary magnet 20 is received in the sleeve 28. The primary magnet 20 is inside the sleeve 28.

The sleeve 28 is configured such that movement of the magnetic assembly 18 in the blind bore 14 is unhindered by the sleeve 28. The sleeve 28 is configured such that in use movement of the magnetic assembly 18 in the blind bore 14 causes the primary magnet 20 to move only within an area of the blind bore 14 defined by the sleeve 28.

In the illustrated example, the sleeve 28 is cylindrical. The switch assembly 12 is seated on a rim 32 of the sleeve 28, which can be an annular rim 32. The rim 32 is an outer edge of the sleeve 28. Accordingly, the sleeve 28 provides an annular rim 32 in the blind bore 14. The switch assembly 12 contacts the rim 32. The rim 32 defines a shoulder on which the switch assembly 12 is seated, which may be a stepped shoulder. In the illustrated example, the center housing molding 27 of the switch assembly 12 is seated on the sleeve 28.

The switch assembly 12 is precisely positioned in the blind bore 14 by being seated on the sleeve 28, i.e., by contacting the rim 32.

Accordingly, the distance between the closed end 30 of the blind bore 14 and the primary magnet 20 is defined by the length of the sleeve 28. Accordingly, the sleeve 28 acts as a positioning device. This distance is critical because in use the magnetic assembly 18 moves to a limited extent in the blind bore 14, as described in detail below. The length of the sleeve 28 is selected such that in use the magnetic assembly 18 may move in the blind bore 14 without the primary magnet 20 contacting the closed end 30 of the blind bore 14. Accordingly, the sleeve 28 is configured such that the primary magnet 20 does not contact the closed end 30 of the blind bore 14. The sleeve 28 is configured to space apart the primary magnet 20 and the closed end 30.

In examples of the disclosure, the length of the sleeve 28 can be precisely controlled and easily checked. Accordingly, the distance between the closed end 30 of the blind bore 14 and the primary magnet 20 can also be precisely controlled and easily checked.

Figure 3:
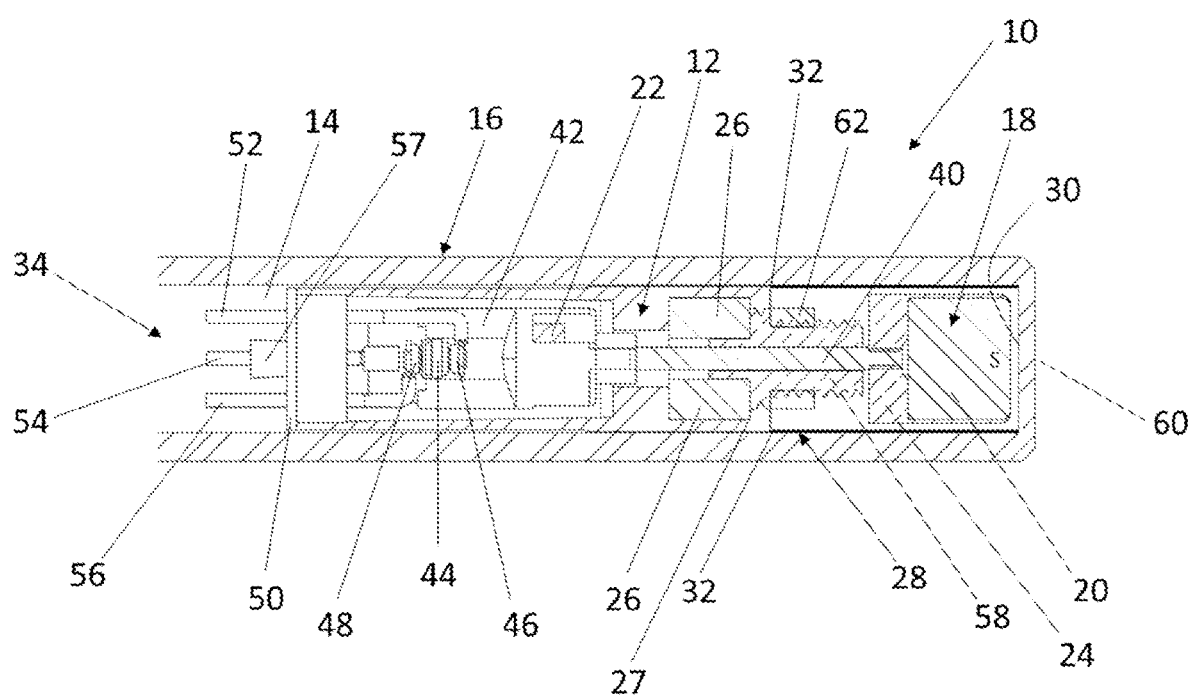
FIG. 3 illustrates a cross sectional view of a part of the magnetic proximity sensor assembly of FIG. 1 in a first condition.
Figure 5:
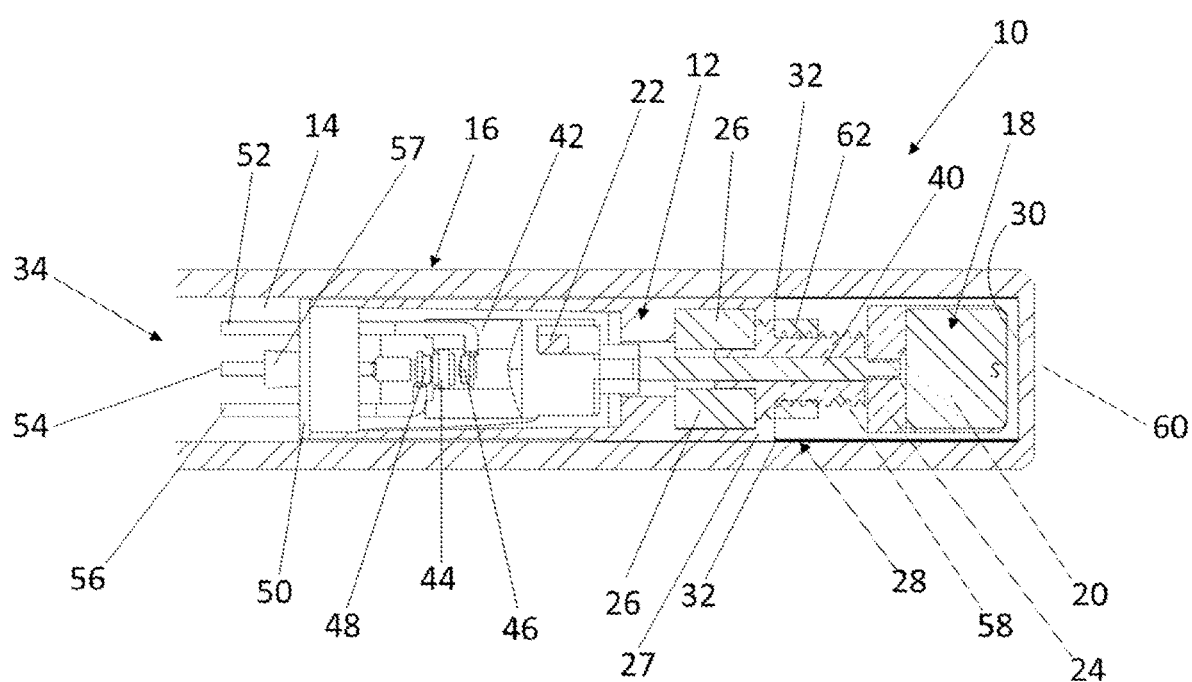
FIG. 5 illustrates a cross sectional view of the part of the magnetic proximity sensor assembly of FIG. 1 in a second condition.
Figure 7:
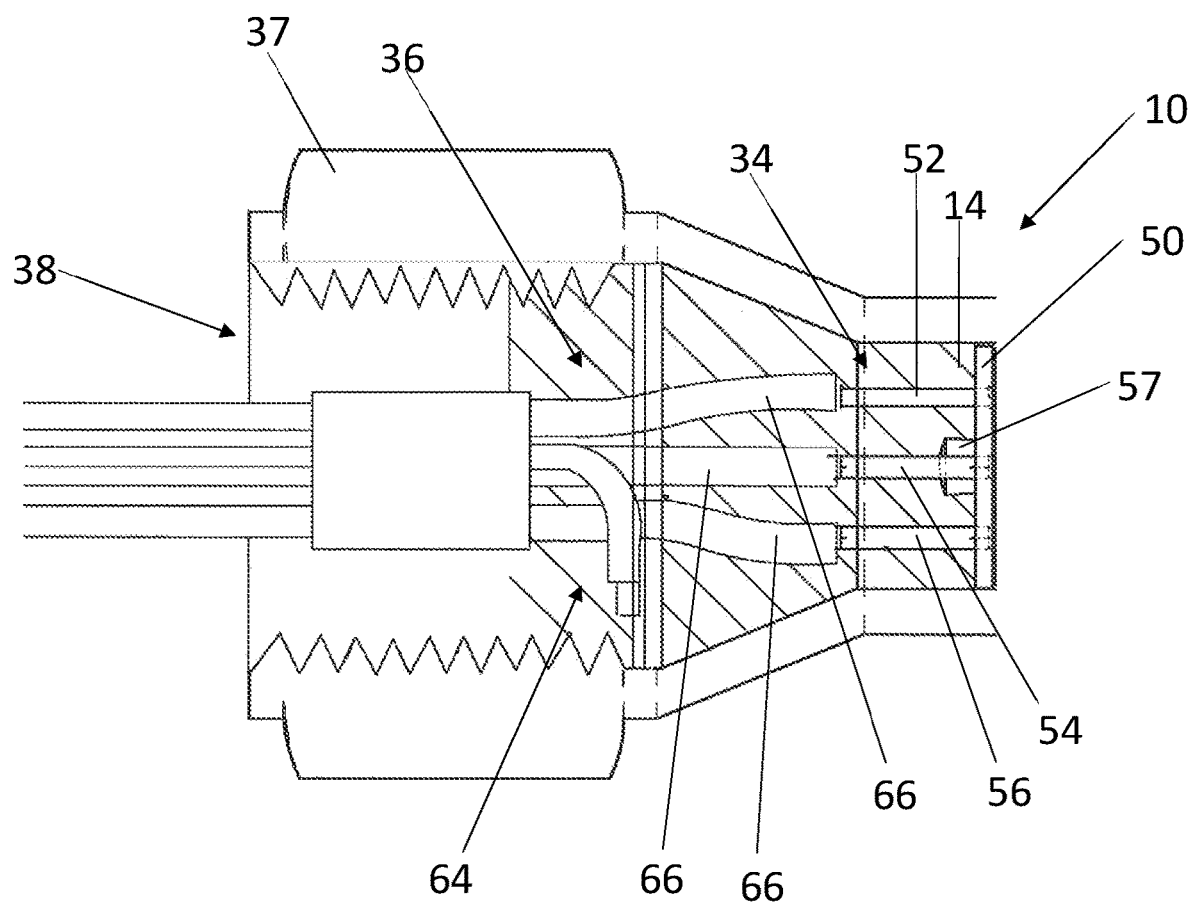
FIG. 7 illustrates a cross sectional view of another part of the magnetic proximity sensor assembly of FIG. 1.

The blind bore 14 extends from the closed end 30 to an open end 34 (see FIGS. 3, 5 and 7). The open end 34 connects with a body tube cavity 36, as illustrated in FIG. 7. The body tube cavity 36 extends to an open end 38 of the body tube 16. The body tube cavity 36 has a diameter larger than the diameter of the blind bore 14. The body tube cavity 36 has a non-uniform diameter. The diameter of the body tube cavity 36 increases towards the open end 38 of the body tube 16. The body tube cavity 36 is provided within an enlarged area 37 of the body tube 16. The enlarged area 37 has the form of a bolt head, such as a standard hex-head bolt head. Accordingly, the body tube 16 is an elongate hollow tubular member comprising the blind bore 14 and the body tube cavity 36.

The biasing magnet 22 is spaced apart from the primary magnet 20, for instance, on a coupling member 40, for example, a shaft. The magnetic assembly 18 may be referred to as a floating shaft.

Accordingly, the center magnet 26 is separated from the primary magnet 20 and the biasing magnet 22. An air gap separates the center magnet 26 from the primary magnet 20, and an air gap separates the center magnet 26 from the biasing magnet 22.

The center magnet 26 is within the magnetic flux zone of the primary magnet 20. The center magnet 26 is within the magnetic flux zone of the biasing magnet 22. The primary magnet 20, center magnet 26 and biasing magnet 22 may be permanent magnets.

The primary magnet 20 and the center magnet 26 are magnetically biased to be attracted to each other. The biasing magnet 22 and the center magnet 26 are magnetically biased to be repelled away from each other. This arrangement causes an internal magnetic bias which causes the magnetic assembly 18 to adopt the magnetically biased position in the blind bore 14 of the body tube 16. Accordingly, the primary magnet 20 and the center magnet 26 have opposite poles facing each other, i.e., north to south or south to north, in order to be magnetically biased to be attracted to each other. The respective opposite poles are proximal. The biasing magnet 22 and the center magnet 26 have the same poles facing each other, i.e., north-to-north or south-to-south, in order to be magnetically biased to be repelled away from each other. The respective same poles are proximal.

As illustrated in FIGS. 3 to 6, the switch assembly 12 also comprises an operator 42 which extends from the magnetic assembly 18 and serves as a drive for a moving contact 44 positioned between a first contact 46 and a second contact 48. In some examples, the first contact 46 is a normally open contact and the second contact 48 is a normally closed contact.

Figure 4:
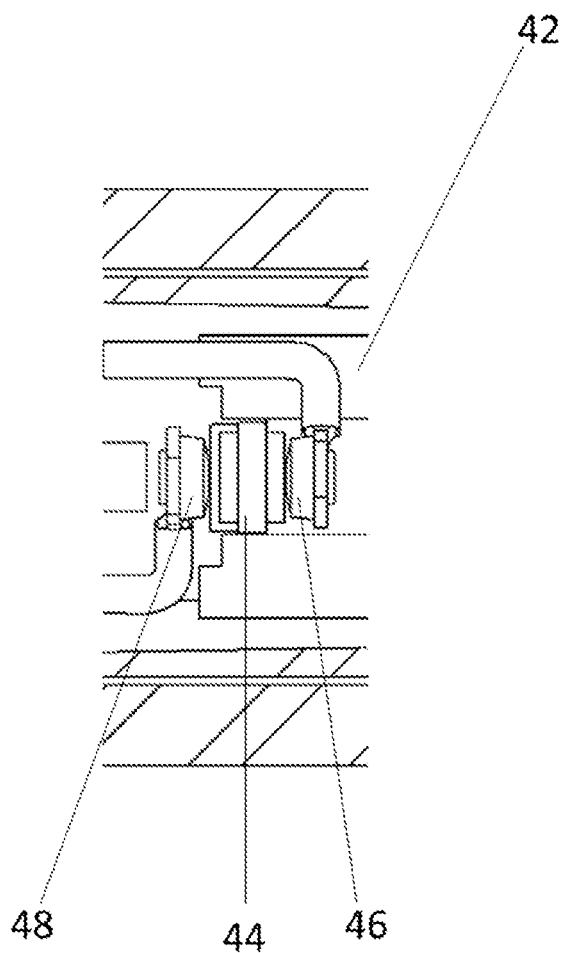
FIG. 4 illustrates a magnification of a part of the part of the magnetic proximity sensor assembly of FIG. 3.

When a target, such as a magnet or ferrous object, is within a sensing range of the magnetic proximity sensor assembly 10, the magnetic assembly moves 18 in the blind bore 14 of the body tube 16 from a magnetically biased position towards the target. Accordingly, the magnetic attraction between the primary magnet 20 and the target overcomes (i.e., overpowers) the internal magnetic bias. The internal magnetic bias is caused by the magnetic repulsion between the biasing magnet 22 and the center magnet 26 and the magnetic attraction between the primary magnet 20 and the center magnet 26. In this position of the magnetic assembly 18, the moving contact 44 is urged by the operator 42 into contact with the first contact 46 to complete a first electrical circuit. In examples in which the first contact 46 is a normally open contact, this may be referred to as the open position of the switch assembly 12. This condition of the magnetic proximity sensor assembly 10 is illustrated in FIGS. 3 and 4, in which the moving contact 44 is contacting the first contact 46 and not contacting the second contact 48. Accordingly, the moving contact 44 is spaced from the second contact 48.

In some examples there is a 0.3 mm or 0.4 mm air gap between the primary magnet 20 and the closed end 30 of the blind bore 14 in this condition of the magnetic proximity sensor assembly 10. The volume of the air gap is defined by the length of the sleeve 28.

Figure 6:
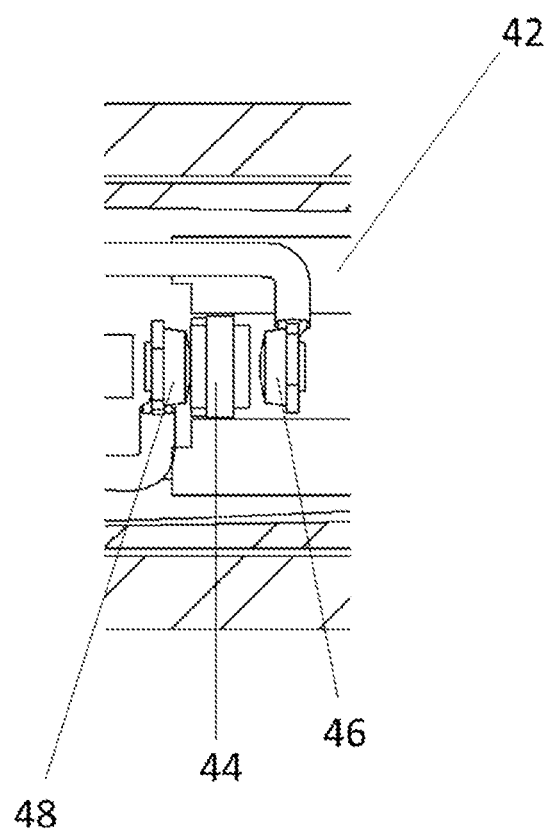
FIG. 6 illustrates a magnification of a part of the part of the magnetic proximity sensor assembly of FIG. 5.

In the absence of the target within the sensing range, the magnetic assembly 18 adopts the magnetically biased position in the blind bore 14 of the body tube 16. The magnetically biased position is adopted because of the internal magnetic bias, as described above. In this position of the magnetic assembly 18, the moving contact 44 is urged by the operator 42 into contact with the second contact 48 to complete a second electrical circuit. This condition of the magnetic proximity sensor assembly 10 is illustrated in FIGS. 5 and 6, in which the moving contact 44 is contacting the second contact 48 and not contacting the first contact 46. Accordingly, the moving contact 44 is spaced from the first contact 46. In examples in which the second contact 48 is a normally closed contact, this may be referred to as the closed position of the switch assembly 12.

As illustrated in FIGS. 3, 5 and 7, the switch assembly 12 also comprises a contact molding 50 with first, second and third contact pins 52, 54, 56 extending therefrom, and a seal plug 57. As is conventional, the contact pins 52, 54, 56 are electrically coupled to the moving contact 44, first contact 46 and/or second contact 48.

FIG. 7 illustrates a cross sectional view of the enlarged area 37 of the body tube 16 of the magnetic proximity sensor assembly 10. In an installed condition, electrical wires extend from the first, second and/or third contact pins 52, 54, 56. The electrical wires may be combined in a single cable 66, or may be separate cables 66. The electrical wires are arranged for being connected with control and/or sensing circuits elsewhere for completing the first electrical circuit and second electrical circuit. The electrical wires extend through the body tube cavity 36 and out of the open end 38 of the body tube 16.

In use, a controller (not illustrated) is configured to continuously supply an electrical input signal to the magnetic proximity sensor assembly 10, and to monitor the electrical output signal using the control and/or sensing circuits. The electrical output signal is different for the first and second electrical circuits. Accordingly, by monitoring the electrical output signal it can be determined whether or not the target is within the sensing range of the magnetic proximity sensor assembly 10.

In one none limiting example, the opening and closing of a valve causes the target to move in and out of the sensing range. Thus, by monitoring the electrical output signal it can be determined whether the valve is open or closed.

In the illustrated example, the magnetic proximity sensor assembly 10 also comprises a flux sleeve 62 located on a flux sleeve holder 58. The switch assembly 12 is seated on the sleeve 28 such that the flux sleeve 62 is also surrounded by the sleeve 28. Accordingly, in such examples the switch assembly 12 is seated on the sleeve 28 such that the primary magnet 20 and the flux sleeve 62 are surrounded by the sleeve 28. In some examples of the disclosure, the magnetic proximity sensor assembly 10 may be provided without a flux sleeve 62.

In some examples, the sleeve 28 comprises mu-metal. The sleeve 28 may consist of mu-metal. The sleeve may be formed from mu-metal. Mu-metal is a soft magnetic alloy with exceptionally high magnetic permeability. The high permeability of mu-metal provides a low reluctance path for magnetic flux. Accordingly, the sleeve 28, which surrounds the primary magnet 20 of the magnetic assembly 18, acts as a magnetic shield against magnetic fields from the primary magnet 20 in the area surrounded.

Figure 9:
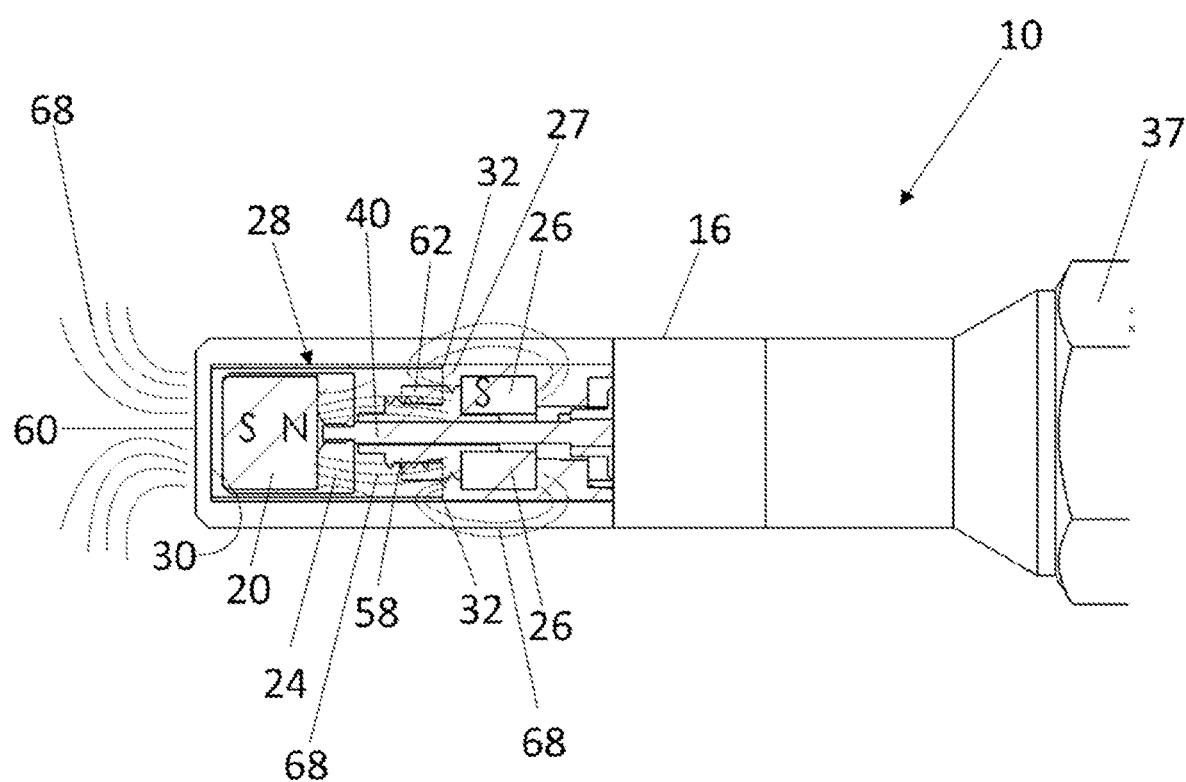
FIG. 9 illustrates a part cross sectional view of a magnetic proximity sensor assembly of FIG. 1 but also showing the magnetic field.

As illustrated in FIG. 9, the mu-metal sleeve 28 works by providing a path for the magnetic field lines 68 around the shielded area, thus focusing the magnetic field from the primary magnet 20 out of the end 60 of the magnetic proximity sensor assembly 10 towards the target, thus optimizing sensing distance.

Magnetic proximity sensor assemblies 10 according to examples of the disclosure may be mounted adjacent to or surrounded by ferrous metals without affecting the sensing distance because the mu-metal sleeve 28 prevents magnetic field from the primary magnet 20 being lost to the adjacent or surrounding ferrous metal. Accordingly, the mu-metal sleeve 28 stops surrounding ferrous metal from robbing flux and reducing the sensing range.

In examples where the sleeve 28 is mu-metal, an advantage of the flux sleeve 62 being surrounded by the mu-metal sleeve 28 is that the flux sleeve's 62 attraction to both the primary magnet 20 and center magnet 26 is shielded from outside interference.

In hazardous environments, electrical contacts 44, 46, 48 have to be shielded from exposure to potentially hazardous atmospheres. As illustrated in FIG. 7, and as is conventional, the switch assembly 12 is hermetically sealed within the body tube 16 using an epoxy resin to provide an end seal assembly 64, i.e., potting. Alternatively, a glass hermetic seal and potting compound may be provided as an end seal assembly 64. The potting fixes and seals internal components. The potting substantially fills the body tube cavity 36.

A method of manufacturing a magnetic proximity sensor assembly 10 according to examples of the disclosure is also provided.

As illustrated in FIG. 8A, the method comprises providing a body tube 16 comprising a blind bore 14, wherein the blind bore 14 has a uniform bore diameter.

As illustrated in FIG. 8B, the method comprises inserting a sleeve 28 into the blind bore 14 such that the sleeve 28 contacts the closed end 30 of the blind bore 14. The sleeve 28 is a separately manufactured part.

The method comprises inserting a switch assembly 12 into the blind bore 14. The method comprises seating the switch assembly 12 on the sleeve 28 such that the primary magnet 20 of the magnetic assembly 18 is surrounded by the sleeve 28, for instance, as illustrated in FIG. 1

The method may comprise providing a body tube 16 comprising a blind bore 14, wherein the blind bore 14 has a uniform bore diameter by a drilling operation. Accordingly, the method comprises forming the blind bore 14 by a drilling operation.

The method may also comprise providing a body tube 16 comprising a body tube cavity 36 by a drilling operation. Accordingly, the method comprises forming a body tube cavity 36 by a drilling operation.

There is thus described a magnetic proximity sensor assembly 10 and a method of manufacture with a number of advantages as described above.

Although embodiments of the present invention have been described in the preceding paragraphs with reference to various examples, it should be appreciated that modifications to the examples given can be made without departing from the scope of the invention as claimed.

Features described in the preceding description may be used in combinations other than the combinations explicitly described.

Although functions have been described with reference to certain features, those functions may be performable by other features whether described or not.

Although features have been described with reference to certain embodiments, those features may also be present in other embodiments whether described or not.

The term "comprise" is used in this document with an inclusive not an exclusive meaning. That is any reference to X comprising Y indicates that X may comprise only one Y or may comprise more than one Y. If it is intended to use "comprise" with an exclusive meaning then it will be made clear in the context by referring to "comprising only one . . . ." or by using "consisting".

In this brief description, reference has been made to various examples. The description of features or functions in relation to an example indicates that those features or functions are present in that example. The use of the term "example" or "for example" or "may" in the text denotes, whether explicitly stated or not, that such features or functions are present in at least the described example, whether described as an example or not, and that they can be, but are not necessarily, present in some of or all other examples. Thus "example", "for example" or "may" refers to a particular instance in a class of examples. A property of the instance can be a property of only that instance or a property of the class or a property of a sub-class of the class that comprise some but not all of the instances in the class. It is therefore implicitly disclosed that features described with reference to one example but not with reference to another example, can where possible be used in that other example but does not necessarily have to be used in that other example.

Whilst endeavoring in the foregoing specification to draw attention to those features of the invention believed to be of particular importance it should be understood that the Applicant claims protection in respect of any patentable feature or combination of features hereinbefore referred to and/or shown in the drawings whether or not particular emphasis has been placed thereon.

The invention claimed is:

1. A magnetic proximity sensor assembly, the magnetic proximity sensor assembly comprising a switch assembly received in a blind bore of a body tube, wherein the switch assembly comprises a magnetic assembly moveable in the blind bore, wherein the switch assembly comprises an operator which extends from the magnetic assembly and serves as a drive for a moving contact positioned between a first contact and a second contact, wherein the magnetic assembly comprises a primary magnet and a biasing magnet, wherein the switch assembly comprises a center magnet interposed between the primary magnet and the biasing magnet, wherein the magnetic proximity sensor assembly comprises a sleeve in the blind bore contacting the closed end of the blind bore, wherein the switch assembly is seated on the sleeve such that the primary magnet of the magnetic assembly is surrounded by the sleeve, and wherein the sleeve comprises mu-metal.

2. A magnetic proximity sensor assembly according to claim 1, wherein the sleeve is configured such that in use movement of the magnetic assembly in the blind bore causes the primary magnet to move only within an area of the blind bore defined by the sleeve.

3. A magnetic proximity sensor assembly according to claim 1, wherein the distance between the closed end of the blind bore and the primary magnet is defined by the length of the sleeve.

4. A magnetic proximity sensor assembly according to claim 1, wherein the sleeve is configured to space apart the primary magnet and the closed end.

5. A magnetic proximity sensor assembly according to claim 1, wherein the blind bore is a cylindrical blind bore.

6. A magnetic proximity sensor assembly according to claim 1, wherein the switch assembly is seated on a rim of the sleeve.

7. A magnetic proximity sensor assembly according to claim 1, wherein, the center magnet is comprised in a center housing molding of the switch assembly, wherein the center housing molding is seated on the sleeve.

8. A magnetic proximity sensor assembly according to claim 1, wherein the sleeve is cylindrical.

9. A magnetic proximity sensor assembly according to claim 1, wherein the magnetic proximity sensor assembly comprises a flux sleeve, wherein the switch assembly is seated on the sleeve such that the flux sleeve is also surrounded by the sleeve.

10. A magnetic proximity sensor assembly according to claim 1, wherein the first contact is a normally open contact and the second contact is a normally closed contact.

11. A magnetic proximity sensor assembly according to claim 1, wherein the blind bore has a uniform bore diameter.

* * * * *